(12) United States Patent
Yang et al.

(10) Patent No.: US 10,508,953 B2
(45) Date of Patent: Dec. 17, 2019

(54) METHOD AND SYSTEM FOR PROCESSING SUBSTRATE BY CHEMICAL SOLUTION IN SEMICONDUCTOR MANUFACTURING FABRICATION

(71) Applicant: Taiwan Semiconductor Manufacturing Co., Ltd., Hsinchu (TW)

(72) Inventors: Min-An Yang, Taichung (TW);
Hao-Ming Chang, Pingtung (TW);
Shao-Chi Wei, Hsinchu (TW);
Kuo-Chin Lin, Tainan (TW);
Sheng-Chang Hsu, New Taipei (TW);
Li-Chih Lu, Taichung (TW);
Cheng-Ming Lin, Siluo Township, Yunlin County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 39 days.

(21) Appl. No.: 15/490,075

(22) Filed: Apr. 18, 2017

(65) Prior Publication Data
US 2018/0161828 A1 Jun. 14, 2018

Related U.S. Application Data

(60) Provisional application No. 62/431,864, filed on Dec. 9, 2016.

(51) Int. Cl.
*G01J 5/00* (2006.01)
*H01L 21/67* (2006.01)
*G01J 5/10* (2006.01)

(52) U.S. Cl.
CPC ............... *G01J 5/0037* (2013.01); *G01J 5/10* (2013.01); *H01L 21/67051* (2013.01);
(Continued)

(58) Field of Classification Search
CPC . B08B 3/08; B08B 3/10; G01J 5/0037; H01L 21/02057; H01L 21/67051; H01L 21/67253
See application file for complete search history.

(56) References Cited

U.S. PATENT DOCUMENTS 6,237,575 B1   5/2001   Lampert et al.
8,648,322 B2   2/2014   Lindner et al.
(Continued)

OTHER PUBLICATIONS

Rizvi, S.; "Handbook of photomask manufacturing technology;" 2006; pp. 5-8.
(Continued)

*Primary Examiner* — Mikhail Kornakov
*Assistant Examiner* — Natasha N Campbell
(74) *Attorney, Agent, or Firm* — McClure, Qualey & Rodack, LLP

(57) ABSTRACT

A method for processing a substrate is provided. The method includes supplying a first flow of a chemical solution into a processing chamber, configured to process the substrate, via a first dispensing nozzle. The method further includes producing a first thermal image of the first flow of the chemical solution. The method also includes performing an image analysis on the first thermal image. In addition, the method includes moving the substrate into the processing chamber when the result of the analysis of the first thermal image is within the allowable deviation from the baseline.

20 Claims, 9 Drawing Sheets

(52) U.S. Cl.
CPC .......................... *H01L 21/67253* (2013.01);
*G01J 2005/0077* (2013.01); *G01J 2005/0081*
(2013.01)

(56) References Cited

U.S. PATENT DOCUMENTS

| | | | |
|---|---|---|---|
| 2003/0143472 A1* | 7/2003 | Koizumi | G03F 1/56 430/5 |
| 2004/0011284 A1* | 1/2004 | Schucker | B05C 5/0216 118/688 |
| 2011/0286738 A1* | 11/2011 | Noda | H01L 21/6715 396/611 |
| 2013/0026381 A1 | 1/2013 | Huang et al. | |
| 2014/0119651 A1* | 5/2014 | Meyers | G06T 5/007 382/167 |
| 2015/0117755 A1* | 4/2015 | Doughty | G06T 7/001 382/151 |
| 2017/0087585 A1* | 3/2017 | Dattilo | H01L 21/67051 |

OTHER PUBLICATIONS

Fossum, E.R., et al.; "Infrared Readout Electronics for Space Science Sensors;" Infrared Technology; XIX; SPIE vol. 2020; 1993; pp. 262-285.

Goodlin, B.F., et al.; "Simultaneous fault detection and classification for semiconductor manufacturing tools;" Journal of The Electrochemical Society; 2003; pp. G778-G784.

\* cited by examiner

METHOD AND SYSTEM FOR PROCESSING SUBSTRATE BY CHEMICAL SOLUTION IN SEMICONDUCTOR MANUFACTURING FABRICATION

PRIORITY CLAIM AND CROSS-REFERENCE

This application claims the benefit of U.S. Provisional Application No. 62/431,864, filed on Dec. 9, 2016, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer. The wet chemical treatment or cleaning is known to be widely used in semiconductor industry. A chemical solution will be ejected from the module (e.g. an arm or a pipe) and then rinse the substrate. In order to treat or clean the material surface properly, an adequate amount of chemical solution is supplied over the substrate.

If the flow or distribution of the chemical solution is not steady, the chemical or physical reaction, such as particle removal, wettability improvement, or developing, may not be achieved and this can result in a serious defect which may affect product quality.

Although existing methods and devices for operating the processing steps have generally been adequate for their intended purposes, they have not been entirely satisfactory in all respects. Consequently, it would be desirable to provide a solution for the process control for semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
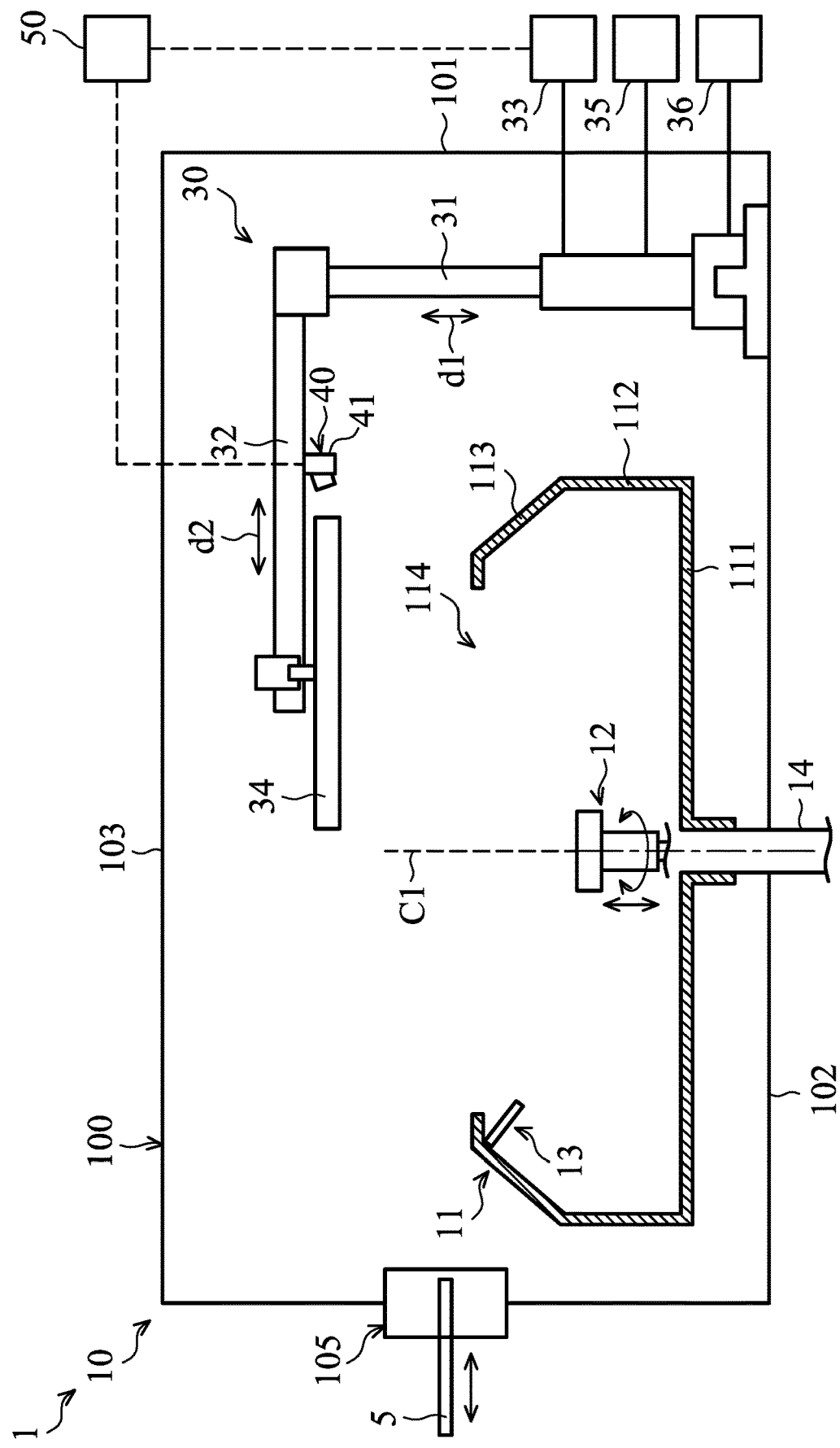
FIG. 1 is cross-sectional view of a substrate processing system, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIG. 1 is cross-sectional view of a substrate processing system 1 for processing a substrate 5, in accordance with some embodiments. The substrate processing system 1 includes a processing chamber 10, a liquid-dispensing module 30, a monitoring module 40, and a control module 50.

In some embodiments, the substrate processing system 1 is configured to supply a chemical solution (such as a developer solution or a cleaning solution) on the substrate 5.

The processing chamber 10 has an interior space 100 defined by a number of walls, such as a lateral wall 101, a bottom wall 102, and a top wall 103. The lateral wall 101 is connected to edges of the bottom wall 102 and extends away from the bottom wall 102. The top wall 103 is connected to the distal end of the lateral wall 101. In some embodiments, the interior space 100 is secluded from the ambient environment. The interior space 100 communicates with the ambient environment via a slot 105 formed on the lateral wall 101. The slot 105 allows the access or retrieval of the substrate 5 to and from the interior space 100.

The processing chamber 10 further includes a catch cup 11 and a substrate stage 12, in accordance with some embodiments. The catch cup 11 and the substrate stage 12 are positioned in the interior space 100.

In some embodiments, the catch cup 11 is configured to provide an environment for depositing a chemical solution on the substrate 5. The catch cup 11 is a circular cup having an open top 114. The upper portion 113 of the cup wall 112 tilts inward to facilitate retaining waste chemical solution within the catch cup 11. The catch cup 11 is connected to an exhaust system via a liquid waste drain 14 formed on the bottom wall 102. As a result, the catch cup 11 is able to catch and drain waste chemical solution via the liquid waste drain 14.

The substrate stage 12 is disposed in the catch cup 11. In some embodiments, the substrate stage 12 is configured for holding, positioning, moving, and otherwise manipulating the substrate 5. In some embodiments, the substrate stage 12 is arranged to move along a main axis C1. The substrate 5 may be secured on the substrate stage 12 by a clamping mechanism, such as vacuum clamping or e-chuck clamping. The substrate stage 12 is designed and configured to be operable for translational and rotational motions. In some embodiments, the substrate stage 12 is further designed to tilt or dynamically change the tilt angle. In some embodiments, the substrate stage 12 is fitted with a suitable heating mechanism to heat the substrate 5 to a desired temperature.

The liquid-dispensing module 30 includes one or more driving mechanism, such as first drive mechanism 31 and second drive mechanism 32, a control unit 33, a dispensing nozzle 34, an energy source 35 and a liquid source 36, in accordance with some embodiments.

The control unit 33, such as a motor, is controlled by the control module 50 and is coupled to the first drive mechanism 31 and the second drive mechanism 32. The control unit 33 is used to actuate the first drive mechanism 31 to move in a vertical direction, as indicated by the arrow d1 shown in FIG. 1. Additionally or alternatively, the control unit 33 is used to actuate the second drive mechanism 32 to move in a horizontal direction, as indicated by the arrow d2 shown in FIG. 1. In some embodiments, the first drive mechanism 31 is rotatable about a vertical axis.

The dispensing nozzle 34 is positioned at the first drive mechanism 31 such that the dispensing nozzle 34 is moved into a particular position in the processing chamber 10. In some embodiments, the dispensing nozzle 34 is mounted at a distal end of the second drive mechanism 32. The dispensing nozzle 34 is used to apply a chemical solution to the substrate 5. The dispensing nozzle 34 is connected to the liquid source 36 to receive the chemical solution from the liquid source 36.

The mixture stored in the liquid source 36 may include an aggregate of two or more substances. Several examples of the mixture are described below.

For example, the mixture stored in the liquid source 36 is a SC1/APM solution mixed with substances including $NH_4OH$, $H_2O_2$, and $H_2O$ in a selected ratio. The SC1/APM solution may be used to clean the wafer and to remove the organic compound and particulate matter that attaches to the substrate surface.

Alternatively, the mixture stored in the liquid source 36 may be a SC2/HPM solution, mixed with a substance including HCl, $H_2O_2$, and $H_2O$ in a selected ratio. The SC2/HPM solution may be used to clean the wafer and to remove the metal dregs that attach to the wafer surface. However, it should be appreciated that many variations and modifications can be made to embodiments of the disclosure.

Alternatively, the mixture stored in the liquid source 36 may be developer solution. The developer solution is intended to remove the relatively more soluble areas of photoresist, and leave behind the remaining patterned image which basically serves as a mask for etching multiple thin film layers on the substrate.

Referring to back to FIG. 1, the energy source 35 is connected to the dispensing nozzle 34. In some embodiments, the dispensing nozzle 34 further includes an energy discharging means (not shown in figures) configured to discharge energy into the chemical solution passing through. The energy source 35 is coupled to the energy discharging means to actuate the operation of the energy discharging means. In some embodiments, the energy discharging means emits UV light into the chemical solution in the dispensing nozzle 34. In some embodiments, the energy discharging means and the energy source 35 are omitted.

Figure 2:
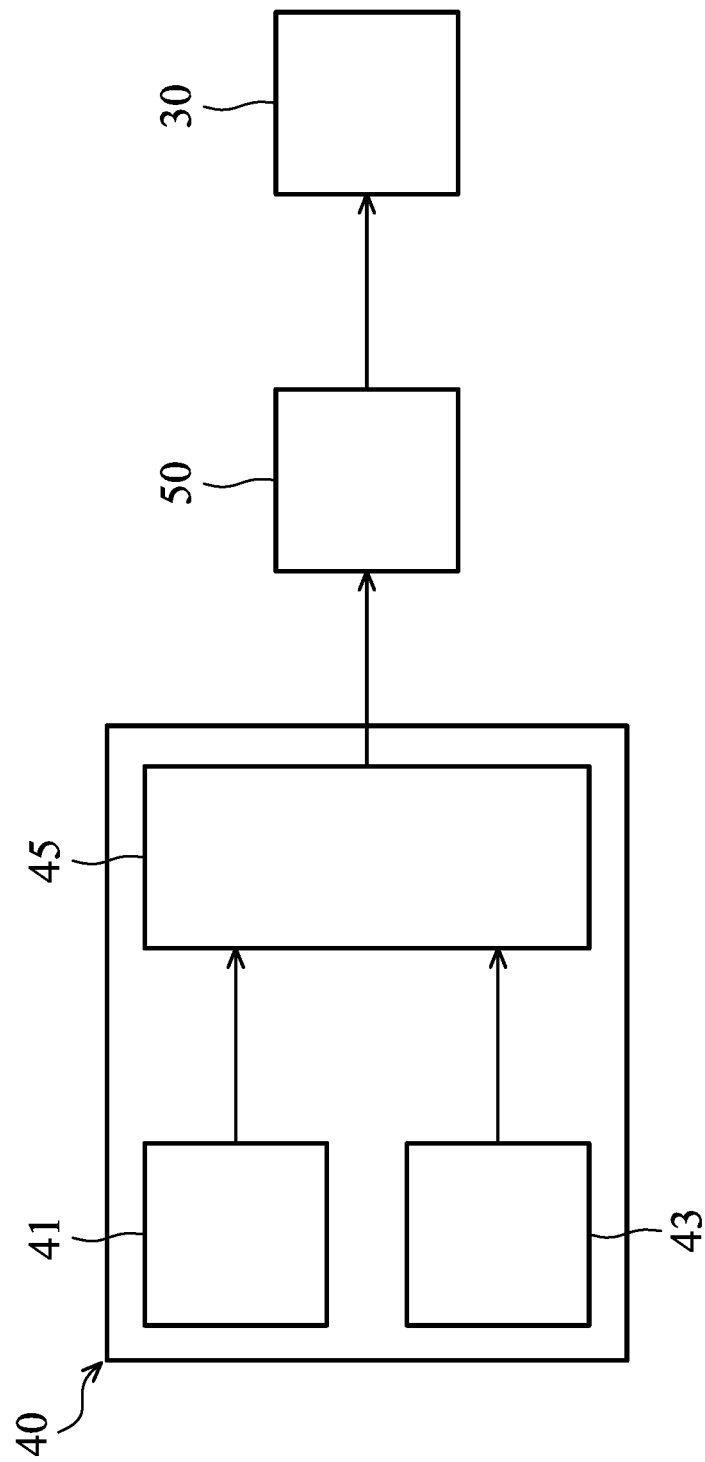
FIG. 2 is a block diagram of partial elements of a substrate processing system, in accordance with some embodiments.

Referring to FIG. 2, the monitoring module 40 includes a thermo-graphic camera 41, an image storage module 43 and an information-handling module 45, in accordance with some embodiments.

The thermo-graphic camera 41 is used to investigate particular objects or locations in the processing chamber 10. In some embodiments, the thermo-graphic camera 41 includes a thermal type sensor, such as poly electric infrared sensor, a thermopile sensor, or a bolometer. In some other embodiments, the thermo-graphic camera 41 includes a photon type sensor, such as IR (Infrared) detector or photocell sensor. The IR detector is a detector that reacts to IR radiation. In operation, the incident light hits the photoelectric cell, and the output current increases as the temperature increases. The IR detector has the advantage of being highly sensitive, precise, and quick to respond. However, it should be appreciated that many variations and modifications can be made to embodiments of the disclosure. The thermo-graphic camera 41 may include thermal sensor, such as Polyelectric infrared sensor, Thermopile or Bolometer.

In some embodiments, as shown in FIG. 1, the thermo-graphic camera 41 is positioned at the liquid-dispensing module 30 such that the thermo-graphic camera 41 is moved to a particular position in the processing chamber 10. In some embodiments, the thermo-graphic camera 41 is mounted at the second drive mechanism 32. However, it should be appreciated that many variations and modifications can be made to embodiments of the disclosure. The thermo-graphic camera 41 can be positioned at any position as long as the chemical solution supplied from the dispensing nozzle 34 can be captured by the thermo-graphic camera 41. For example, the thermo-graphic camera 41 is mounted on the top wall 103 of the interior space 100 and above the catch cup 11.

Referring back to FIG. 2, the image storage module 43 is used to stored information of the thermal images feed from the thermo-graphic camera 41. Additionally or alternatively, the image storage module 43 is used to stored information of reference images. In some embodiments, the reference images are thermal images in relation to chemical solution in the processing chamber known to have processed an accepted substrate. The image storage module 43 may be a floppy drive, hard drive, CD-ROM, optical device or any other storage device.

The information-handling module 45 is operable to receive, store, manipulate, analyze, and/or perform other actions on an image provided by the thermo-graphic camera 41 and/or the image storage module 43. The information-handling module 45 includes hardware capable of executing machine-readable instructions. For example, the information-handling module 45 includes a processor and a system memory. The system memory may be configured to store a design database, algorithms, images, graphs, simulations, and/or other information.

In addition, the information-handling module 45 includes software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example.

The control module 50 is configured to send control data to the dispensing module 30. The dispensing module 30 is operated according to the control data. In some embodiments, the control data from the control module 50 is related to the image information data from the information-handling module 45.

In some embodiments, the control module 50 compares image analyzed results from the information-handling module 45 with a baseline to detect faults as well as classify or determine the root cause of any variances between the baseline and current operation. In some embodiments, the control module 50 includes applications for managing alarm/fault conditions. When an alarm and/or fault condition is detected, the control module 50 can send a message to the dispensing module 30.

The techniques used for the control module 50 include statistical process control (SPC), principle component analysis (PCA), partial least squares (PLS), other suitable techniques, and combinations thereof. The control module 50 may be a fault detection and classification (FDC) module and comprises a computer integrated manufacturing (CIM) host.

Figure 3:
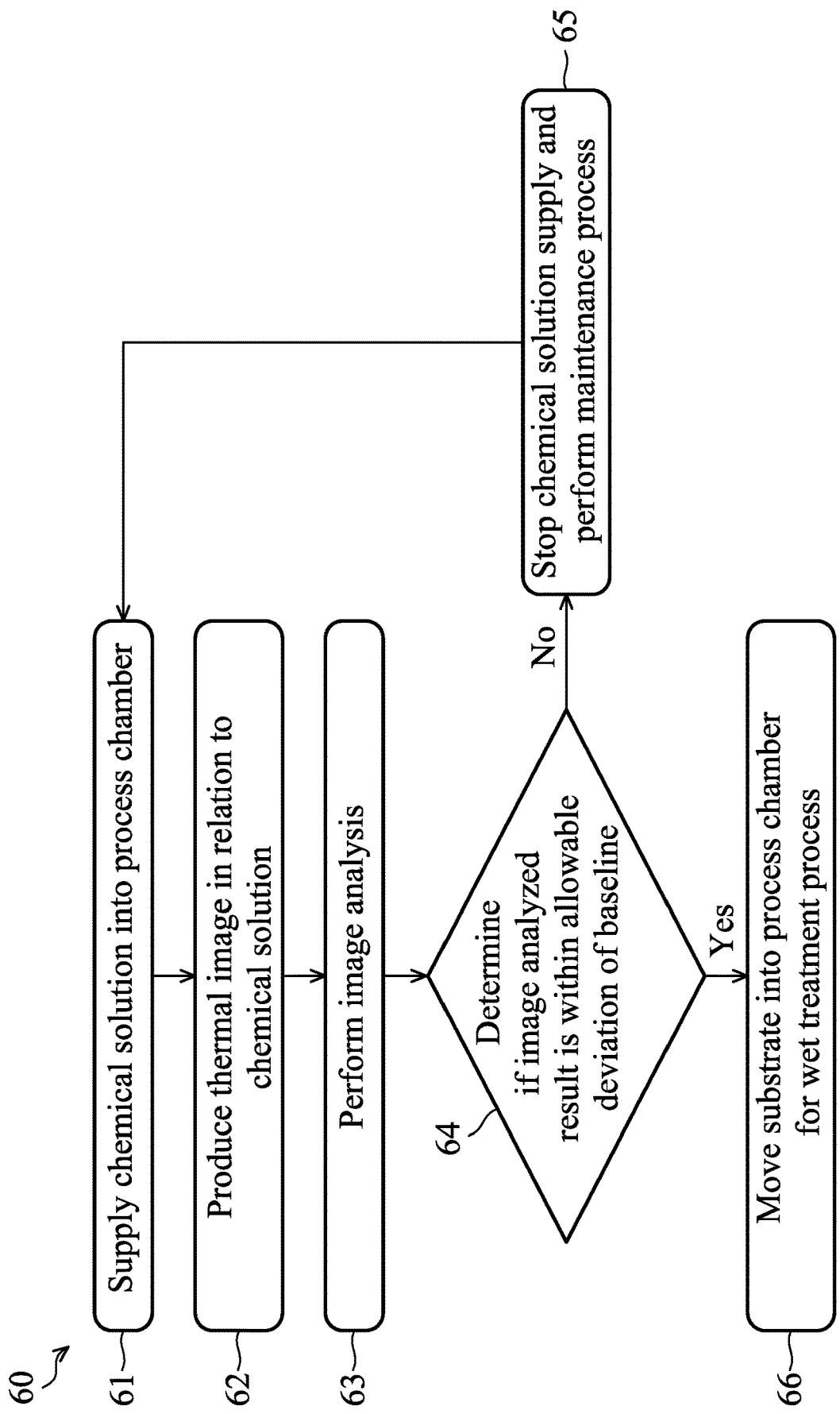
FIG. 3 is a flow chart of methods for processing a substrate, in accordance with some embodiments.

FIG. 3 is a flow chart illustrating a method 60 for processing a substrate 5, in accordance with some embodiments. For illustration, the flow chart will be described along with the schematic views shown in FIGS. 5-7. Some of the stages described can be replaced or eliminated for different embodiments. Additional features can be added to the semiconductor device structure. Some of the features described below can be replaced or eliminated for different embodiments.

In order to improve the production yields of the substrate 5 which is going to be processed by the processing chamber 10, a liquid flow monitoring process is performed before the sending of the substrate 5 into the processing chamber 10. The liquid flow monitoring process includes operations 61-64.

Figure 4:
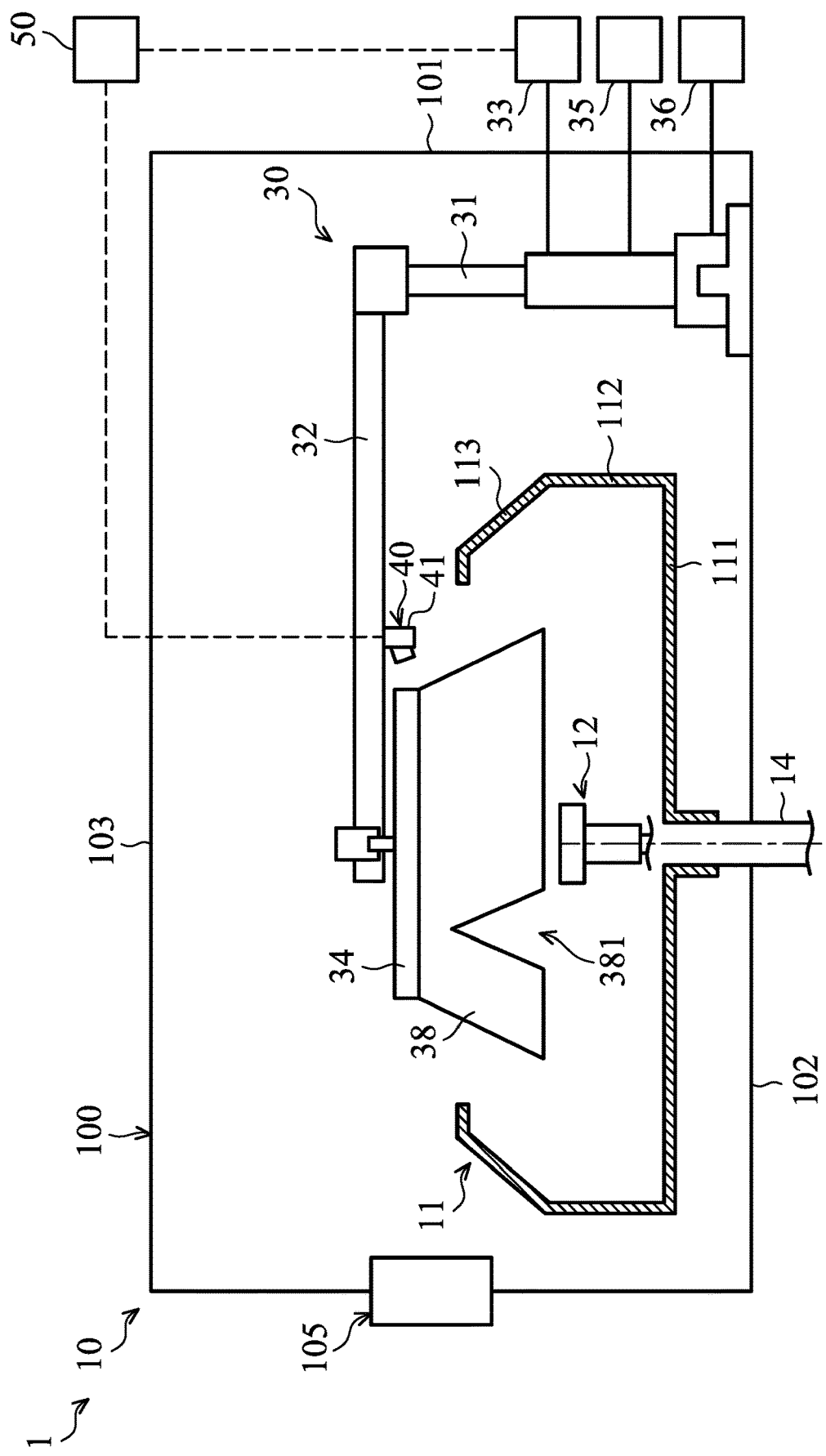
FIG. 4 is a cross-sectional view of one stage of a process for supplying a chemical solution in a substrate processing system with liquid flow defect, in accordance with some embodiments.

In operation 61, a flow 38 of a chemical solution is supplied into the processing chamber 10. In some embodiments, as shown in FIG. 4, the flow 38 of chemical solution is supplied from the liquid source 36 via the dispensing nozzle 34 into the processing chamber 10. It should be noted that while the embodiment shown in FIG. 4 utilizes the dispensing nozzle 34 for supplying the flow 38 of the chemical solution, different dispensing nozzle for supplying the chemical solution in different fashion can be utilized for supplying the chemical solution.

In some embodiments, before the supply of the flow 38 of the chemical solution, the dispensing nozzle 34 is moved and lowered over the substrate stage 12. The flow 38 of the chemical solution is supplied on the surface of the substrate stage 12. The flow 38 of the chemical solution may be a developer solution.

Figure 5:
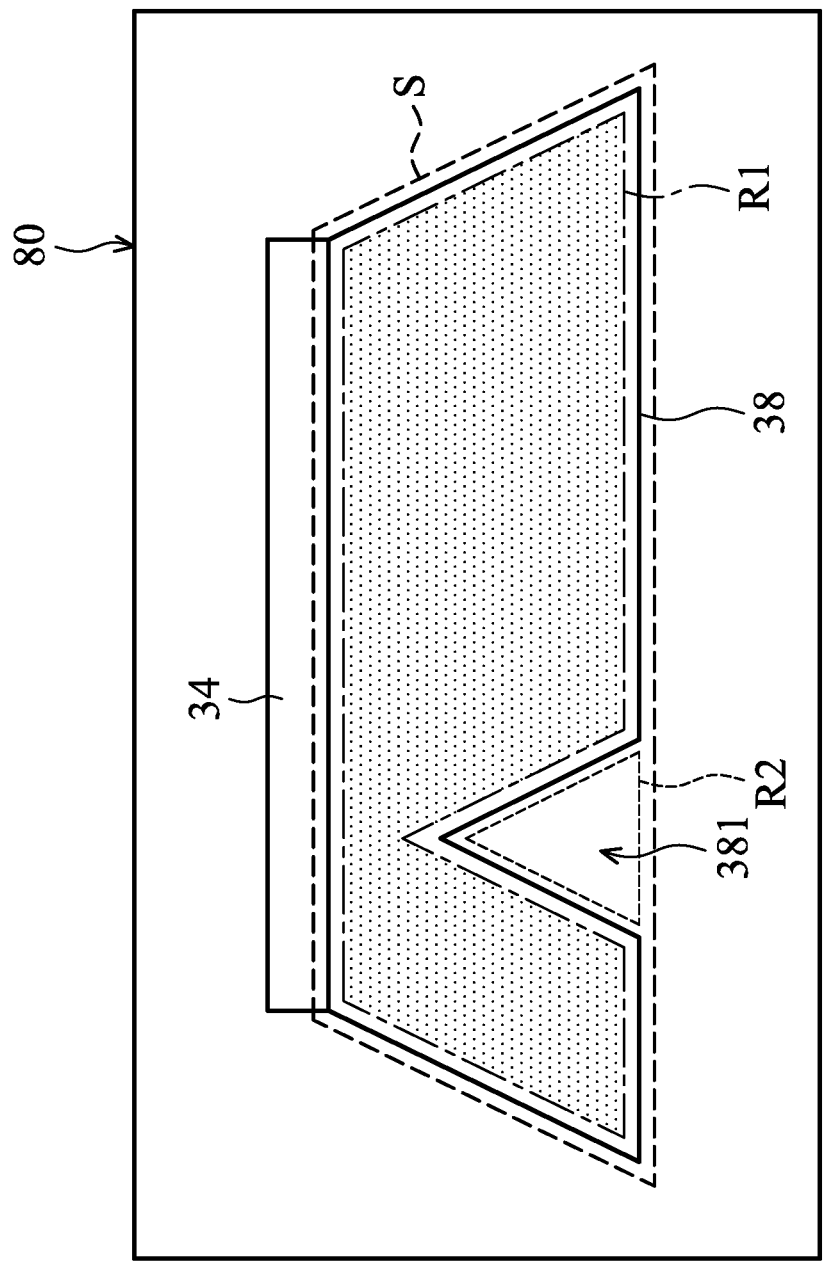
FIG. 5 shows a thermal image in relation to a chemical solution supplied from a dispensing nozzle.

In operation 62, one or more thermal images 80 of the flow 38 of the chemical solution are produced by the thermo-graphic camera 41. In some embodiments, the flow 38 of the chemical solution supplied from the dispensing nozzle 34 has a substantially the same electromagnetic radiation of wavelengths. Therefore, as shown in FIG. 5, a region R1 of the thermal image 80 corresponding to the area through which the flow 38 of the chemical solution passes has substantially the same image characteristics (such as color and brightness). For example, the region R1 of the thermal image 80 corresponding to the area with the flow 38 of the chemical solution is red.

As an alternative, the image characteristics (such as brightness and wavelength) of each pixel in the region R1 are within a specific range. For example, the wavelength of each pixel in the region R1 of the thermal image 80 is in a range from about 3 μm to about 12 μm which included from mid-wavelength infrared to far-infrared. The image characteristics of region R1 of the thermal image 80 may be dependent upon the temperature of the flow 38 of the chemical solution.

In some embodiments, there is a significant difference between the electromagnetic radiation of wavelengths of the flow 38 of the chemical solution and the electromagnetic radiation of wavelengths of other elements located in the processing chamber 10, such as the dispensing nozzle 34 and the substrate stage 12. Therefore, a high contrast image is captured by the thermo-graphic camera 41.

In some embodiments, as shown in FIG. 5, there is a vacant area 381 formed in a path of travel of the flow 38 of the chemical solution. The vacant area 381 refers to an area through which no flow 38 of the chemical solution passes. The vacant area 381 may be the result of deformation of the dispensing nozzle 34 due to application of thrust force. Alternatively, the vacant area 381 may be the result of obstruction caused by debris in the outlet of the dispensing nozzle 34.

With no flow 38 of the chemical solution passing through, a region R2 of the thermal image 80 corresponding to the area where the vacant area 381 is located has different image characteristics from that of region R1. For example, region R2 of the thermal image 80 may have lower gray levels than that of region R1. Alternatively and additionally, region R2 of the thermal image 80 may be a different color than that of region R1.

In operation 63, an image analysis is performed. In some embodiments, the information-handling module 45 (FIG. 2) receives the thermal image 80 produced by the thermo-graphic camera 41 and analyzes the thermal image 80. Several examples of the techniques used for image analysis are described below.

In some embodiments, the image analysis comprises performing an image comparison between the thermal image and a reference image to determine a difference. The reference image may have been previously captured and stored. The reference image may be a thermal image in relation to a chemical solution in the processing chamber known to have processed an accepted substrate (e.g., a substrate with no defects or a substrate with acceptable product yield). The comparison of the thermal image and the reference image may indicate the presence of a defect of the chemical solution.

The comparison between images may be performed in various ways. For example, the images may be provided in grayscale, pseudo color, and/or other raster forms. The comparison may be performed by manual inspection, or by a system designed to analyze differences in color and/or grayscale between the two images. In an embodiment, the images to be compared are provided as grayscale images and the gray level of the reference image subtracted from the gray level of the thermal image to determine a "difference".

The comparison may be conducted on the entire area of the thermal image 80. Alternatively, the comparison may be conducted on one or more selected regions of the thermal image 80. In some embodiments, a region S of the thermal image 80 is selected. The region S corresponds to a region in the reference image through which the chemical solution passes. The comparison is conducted on the region S of the thermal image 80. The comparison may be conducted on a pixel-by-pixel basis, a matrix of pixels (e.g., 3×3, 5×5), and/or another predefined region of the image (e.g., such as by averaging the values of a region).

In the embodiment shown in FIG. 5, since the region R2 of image 80 has different image characteristics than the reference image, a difference is determined by the information-handling module 45, and the information-handling module 45 sends the result of the analysis of the image to the control module 50.

In some embodiments, the image analysis comprises calculating an area of a specific color in the thermal image 80. In some embodiments, the thermal image 80 is analyzed by sorting the information of the image into selected groupings. The sorting may include determining the number of counts or occurrences of a given value in the image. For example, a pseudo color image may be analyzed and the occurrence of each of the plurality of colors may be determined. In another example, a grayscale image may be analyzed and the occurrence of various values determined.

The sorting may be conducted on the entire area of the thermal image 80. Alternatively, the sorting may be conducted on one or more selected regions of the thermal image 80. In some embodiments, a region S of the thermal image 80 is selected. The region S corresponds to a region in the reference image through which the chemical solution passes. The sorting is conducted on the region S of the thermal image 80. The sorting may be conducted on a pixel-by-pixel basis, a matrix of pixels (e.g., 3×3, 5×5), and/or other predefined region of the image (e.g., such as by averaging the values of a region). After the sorting is completed, the information-handling module 45 sends the result of the analysis of the image to the control module 50.

In operation 64, the result of the analysis of the image from the information-handling module 45 is compared with a baseline by the control module 50 to detect if faults occur or not. In the case of image comparison, the control module 50 may determine that an alarm and/or fault condition occurs when the number of pixels that are different from the pixels in the reference image is greater than a preset value. In the case of color sorting, the control module 50 may determine that a fault occurs when a specific color (e.g., red color) is smaller than a preset value.

When an alarm and/or fault condition is detected, operation 65 is initiated. In operation 65, the supply of the chemical solution is terminated and a maintenance process is performed. In some embodiments, a warning signal is issued by the control module 50 when an alarm and/or fault condition is detected. The warning signal is sent to the dispensing module 30 to stop the supply of the chemical solution into the process chamber 10. In addition, the warning signal triggers the operation of warning equipment (such as a warning light or warning ring not shown in figures) to call a personnel to perform a maintenance process. In the maintenance process, the dispensing nozzle 34 may be displaced by a new dispensing nozzle 34. Afterwards, the liquid flow monitoring process of operations 61-64 is repeated again.

Figure 6:
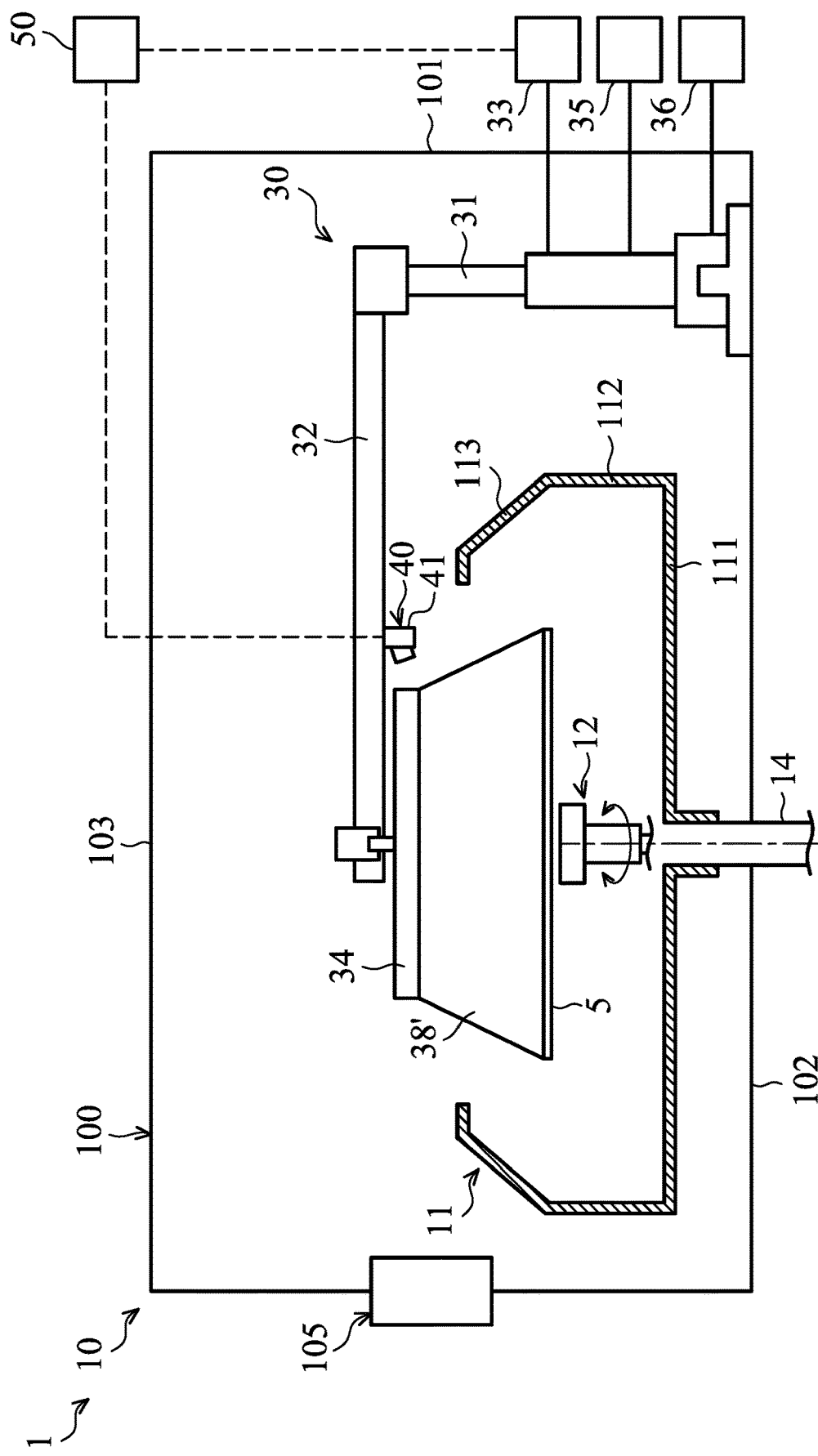
FIG. 6 is a cross-sectional view of one stage of a process for supplying a chemical solution in a substrate processing system after liquid flow adjustment and substrate moving into processing chamber, in accordance with some embodiments.

In a condition wherein no alarm and/or fault condition is detected, operation 66 is initiated. In operation 66, as shown in FIG. 6, the substrate 5 is sent into the processing chamber 10 via the slot 105. In some embodiments, the substrate 5 is moved into the processing chamber 10 after the end of a preset time period for supplying the flow 38' of the chemical solution.

In an embodiment, the substrate 5 is a photo mask or reticle. Before being sent into the processing chamber 10, the substrate 5 may exposed by electron beam to write fine pattern on a resist supplied on the substrate 5. The substrate 5 may be a transparent substrate such as fused silica ($SiO_2$), or quartz, relatively free of defects, calcium fluoride, and/or other suitable material used in a photolithography process. The features may include attenuating material operable to pattern an incident radiation beam. The attenuating material may include chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination thereof.

In another embodiment, the substrate 5 is a device substrate such as a semiconductor substrate (e.g., wafer). The substrate may be a semiconductor substrate that includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

The substrate may be strained, may be a semiconductor on insulator (SOI), have an epitaxial layer, and/or have other features enhancing performance. The substrate may include any number of semiconductor device features or portions thereof, for example, transistors including gate structures, doped regions such as source/drain regions, diodes including light emitting diode (LED) structures, memory cells, sensors, microelectromechanical systems (MEMS), and the like. The substrate may include any number of layers such as, conductive layers, insulating layers, etch stop layers, capping layers, diffusion/barrier layers, gate layers, hard mask layers, interfacial layers, and/or numerous other suitable layers. Alternatively, although processing a substrate in the form of a semiconductor wafer may be described; it is to be understood, that other examples of substrates and processes may benefit from the present invention such as, for example, printed circuit board substrates, damascene processes, and thin film transistor liquid-crystal display (TFT-LCD) substrates and processes.

In an embodiment directed to a device substrate, the features may include features, or portions thereof, of a semiconductor device(s) formed on the substrate 5. The semiconductor device(s) may include active or passive devices. For example, the semiconductor device may include passive components such as resistors, capacitors, inducers, fuses and/or active devices such as p-channel field effect transistors (PFETs), n-channel transistors (NFETs), metal-oxide-semiconductor field effect transistors (MOSFETs), complementary metal-oxide-semiconductor transistors (CMOSs), high-voltage transistors, high-frequency transistors, and/or other suitable components or portions thereof. In an embodiment, the features are gate features associated with one or more transistors formed on the substrate. In another embodiment, the features are interconnect features associated with one or more transistors formed on the substrate. The features may include conductive material, semi-conductive material, or insulating material.

Afterward, the substrate 5 is subjected to a wet treatment process in the processing chamber 10. In some embodiments, the wet treatment process includes a development process. Specific processes including a photoresist coating process and electron beam writing process or exposure process may be carried out before the development process. In the development process, the flow 38 of the developer solution is supplied over the substrate 5 to remove the relatively more soluble areas of photoresist, and leave behind the remaining patterned image which basically serves as a mask for etching multiple thin film layers on the substrate 5. The substrate 5 may be continuously rotated during the supply of the chemical solution.

In the above mentioned embodiments, since the flow of the developer solution is monitored and adjusted dynamically before the substrate 5 is sent into the processing chamber 10, the flow of the developer solution supplied over the substrate 5 has a high uniformity. Therefore, a critical dimension (CD) of the features on the substrate 5 could be well controlled or defect counts could be decreased. In addition, if a number of substrates are treated with the developer solution according to the invention, then their mean values in the application of developer solution are well controlled.

Figure 7:
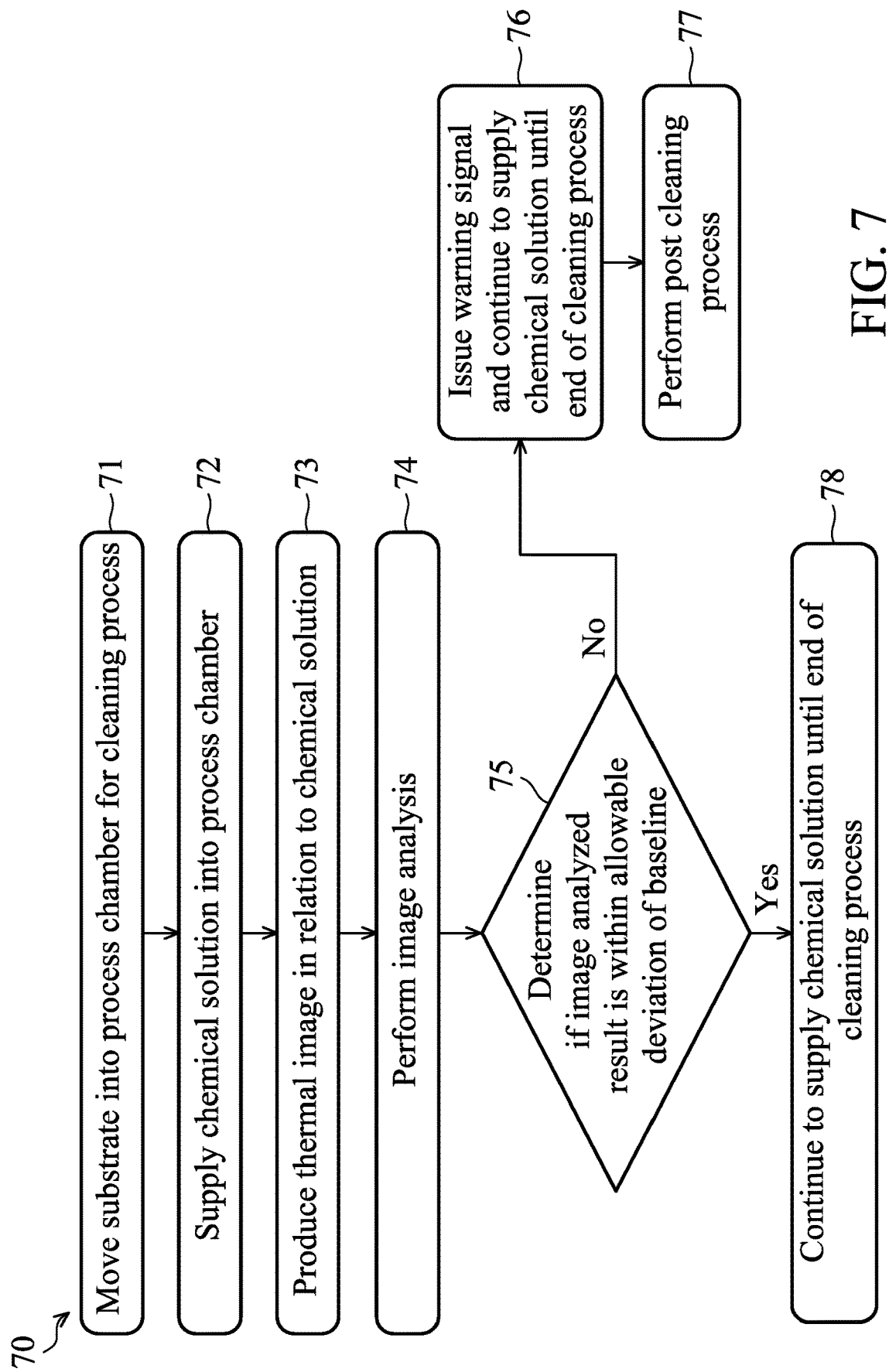
FIG. 7 is a flow chart of methods for processing a substrate, in accordance with some embodiments.

FIG. 7 is a flow chart illustrating a method 70 for processing a substrate 5, in accordance with some embodiments. For illustration, the flow chart will be described along with the schematic views shown in FIGS. 8-9. Some of the stages described can be replaced or eliminated for different embodiments. Additional features can be added to the semiconductor device structure. Some of the features described below can be replaced or eliminated for different embodiments.

In some embodiments, the substrate 5 is cleaned by the method 70. In cases where the substrate 5 is a photo mask, the method 70 may be performed after an inspection and before an operation for mounting pellicle on the photomask to prevent particles stays between pellicle and the photo mask. However, it should be appreciated that many variations and modifications can be made to embodiments of the disclosure. The method 70 may be formed at any cleaning stage in the manufacturing of photo mask or semiconductor wafer. For example, the method 70 is performed after hard mask stripping or after MoSiON etching.

The method 70 beings with operation 71, in which substrate 5 is moved into the processing chamber 10. The substrate 5 is fixed in the processing chamber 10 by the substrate stage 12.

The method 70 continues with operation 72, in which a first flow 38a of a chemical solution is supplied over the substrate 5 via the dispensing nozzle 34a. The chemical solution may be a cleaning solution, such as SC1/APM solution or a SC2/HPM solution. It should be noted that while the embodiment shown in FIG. 9 utilizes the dispensing nozzle 34a for supplying the chemical solution, different dispensing nozzle for supplying the chemical solution in different fashion can be utilized for supplying the chemical solution.

In some embodiments, during the supplying of the first flow 38a of the chemical solution, energy is discharged over the first flow 38a of the chemical solution. The energy may be an ultraviolet radiation. Therefore, an element such as ozone in the first flow 38a of the chemical solution is irradiated by the ultraviolet radiation to decompose the contamination such as organic molecules on the substrate 5.

To monitor the cleaning process is performed properly, the method 70 continues to operations 72-75 to perform a liquid flow monitoring process.

In operation 73, one or more thermal images of the first flow 38a of the chemical solution are produced by the thermo-graphic camera 41. In operation 74, an image analysis is performed on the thermal image of the first flow 38a of the chemical solution. It is noted that in the case that an ultraviolet radiation is discharged into the first flow 38a of the chemical solution, since the thermo-graphic camera 41 is free interfered by wavelength below 700 nm, the energy of the ultraviolet radiation is ignored by the thermo-graphic camera 41. Therefore, a clear thermal image of the first flow 38a of the chemical solution can be produced.

In operation 75, the result of the analysis of the thermal image from the information-handling module 45 is compared with a baseline by the control module 50 to detect if faults occur or not. Techniques used in operations 73-75 can be similar to those used in operations 62-64 of method 60 shown in FIG. 3. Hereinafter, embodiments that are the same or similar to those previously described are not repeated for brevity.

Figure 8:
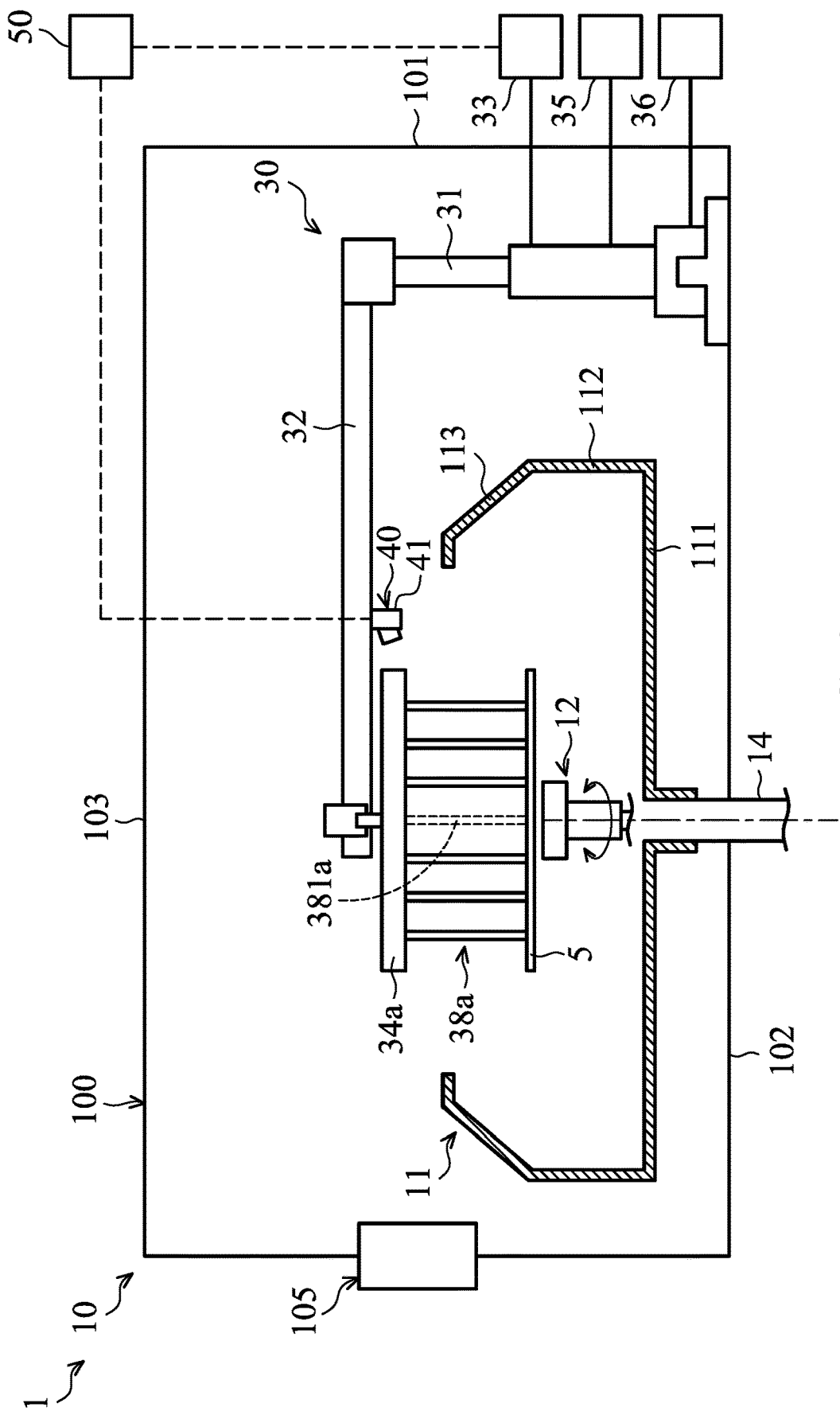
FIG. 8 is a cross-sectional view of one stage of a process for supplying a chemical solution in a substrate processing system with liquid flow defect, in accordance with some embodiments.

In the embodiment shown in FIG. 8, a vacant area 381a is formed in the first flow 38a of the chemical solution. As a result, an alarm and/or fault condition is detected in operation 75, and the method 70 continues to operations 76 and 77.

In operation 76, a warning signal is issued by the control module 50. In some embodiments, the warning signal trigger the operation of a warning equipment (such as a warning light or warning ring not shown in figures) to call personnel to perform a maintenance process. In the maintenance process, the dispensing nozzle 34a may be displaced by a new dispensing nozzle 34a.

Figure 9:
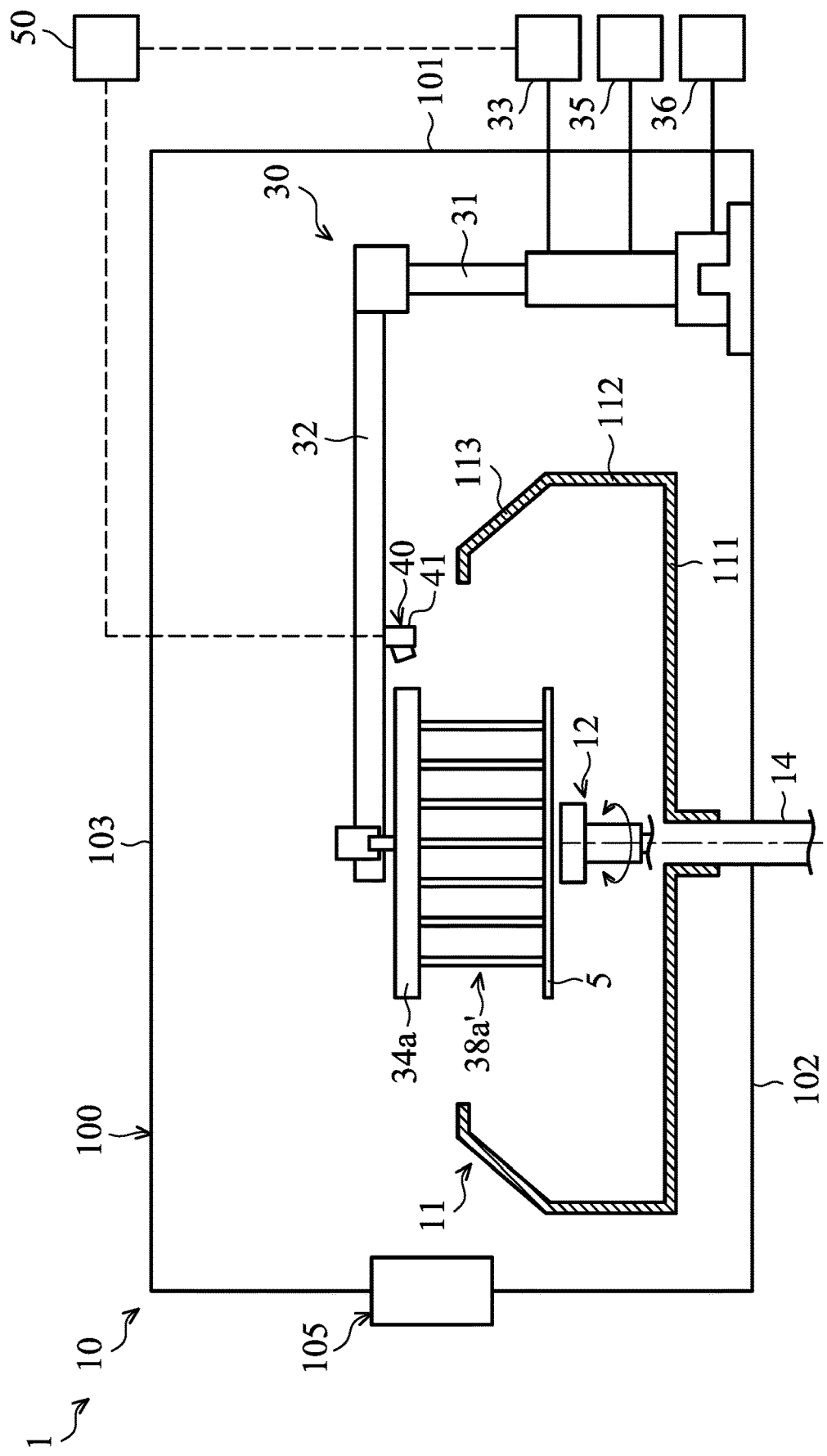
FIG. 9 is a cross-sectional view of one stage of a process for supplying a chemical solution in a substrate processing system after liquid flow adjustment, in accordance with some embodiments.

In operation 77, a post cleaning process is performed. The substrate 5 may be kept in the processing chamber 10 and be subjected to a cleaning process again by a second flow 38a' of the chemical solution supplied by the new dispensing nozzle 34a, as shown in FIG. 9. Alternatively, the substrate 5 may be moved to another processing chamber 10 for cleaning again.

In some embodiments, the supply of the first flow 38a of the chemical solution is stopped after a predetermined period of time when the warning signal is issued. For example, the supply of the first flow 38a of the chemical solution is not stopped until the end of a preset time period for supplying the first flow 38a of the chemical solution, even if the warning signal is issued. In some embodiments, the supply of the first flow 38a of the chemical solution is immediately stopped as the warning signal is issued so as to reduce the generation of waste liquid.

If no alarm and/or fault condition is detected in operation 75, and the method 70 continues to operation 78. In operation 78, the substrate 5 is continuously cleaned by the flow of the chemical solution until the end of a preset time period for supplying the flow of the chemical solution.

Embodiments of apparatus and method for dynamically detecting and adjusting the distribution of the flow of the chemical solution in the processing chamber are provided. An infrared (IR) detector is used to detect and send the thermal image to the analysis center then to the control module in order to highlight the abnormal condition and monitor the process dynamically. Therefore, a flow of chemical solution that has a disorder which may cause the efficiency of removing the photoresist or particles to suffer, or which may cause a production defect, and thereby have a negative impact on CD uniformity, can be detected and adjusted.

In accordance with some embodiments, a method for processing a substrate is provided. The method includes supplying a first flow of a chemical solution into a processing chamber, configured to process the substrate, via a first dispensing nozzle. The method further includes producing a first thermal image of the first flow of the chemical solution. The method also includes performing an image analysis on the first thermal image. In addition, the method includes moving the substrate into the processing chamber when the result of the analysis of the first thermal image is within the allowable deviation from the baseline.

In accordance with some embodiments, a method for processing a substrate is provided. The method includes supplying a first flow of a chemical solution over the substrate via a first dispensing nozzle. The method further includes producing a thermal image of the first flow of the chemical solution and performing an image analysis on the thermal image. The method also includes issuing a warning signal when the result of the analysis of the thermal image is outside the allowable deviation from the baseline. In response to the warning signal, the supply of the first flow of the chemical solution is terminated. The method also includes supplying a second flow of the chemical solution over the substrate via a second dispensing nozzle.

In accordance with some embodiments, a substrate processing system for supplying a chemical solution over a substrate is provided. The substrate processing system includes a processing chamber and a liquid-dispensing module. The liquid-dispensing module is connected to the processing chamber and configured to supply a chemical solution into the processing chamber. The substrate processing system further includes a thermo-graphic camera. The thermo-graphic camera is positioned in the processing chamber and configured to record a thermal image of the chemical solution from the supplying module. The information-handling module also includes information-handling module. The information-handling module is connected to the thermo-graphic camera and configured to analyze the thermal image recorded by the thermo-graphic camera. In addition, the substrate processing system includes a control module. The control module is connected to the information-handling module. When the result of the analysis of the thermal image is outside an allowable deviation from a baseline, the control module issues a warning signal so as to enable an adjustment of the liquid-dispensing module.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for processing a substrate, comprising:
   supplying a flow of a chemical solution into a processing chamber, configured to process the substrate, via a first dispensing nozzle;
   producing a first thermal image of the flow of the chemical solution without positioning the substrate in the processing chamber;
   performing an image analysis on the first thermal image; and
   moving the substrate into the processing chamber when the result of the analysis of the first thermal image is within an allowable deviation from a baseline.

2. The method as claimed in claim 1, further comprising:
   terminating the supply of the flow of the chemical solution when the result of the analysis of the first thermal image is outside the allowable deviation from the baseline; and
   issuing a warning signal for a maintenance process.

3. The method as claimed in claim 1, wherein the thermal image is captured by an infrared (IR) detector.

4. The method as claimed in claim 1, further comprising discharging an ultraviolet radiation to the chemical solution.

5. The method as claimed in claim 1, wherein the image analysis comprises performing an image comparison.

6. The method as claimed in claim 1, wherein the image analysis comprises calculating an area of a specific color in the thermal image.

7. The method as claimed in claim 1, wherein the substrate comprises a photo mask or a semiconductor wafer.

8. A method for processing a substrate, comprising:
   producing an initial thermal image of an initial flow of a chemical solution supplied into a processing chamber when no substrate is positioned in the processing chamber;
   moving the substrate into the processing chamber when an analysis result of the initial thermal image is acceptable;
   supplying a first flow of the chemical solution over the substrate via a first dispensing nozzle;
   producing a thermal image of the first flow of the chemical solution;
   performing an image analysis on the thermal image;
   when the result of the analysis of the thermal image is outside an allowable deviation from a baseline, issuing a warning signal;
   terminating the supply of the first flow of the chemical solution; and
   supplying a second flow of the chemical solution over the substrate via a second dispensing nozzle in response to the warning signal; and
   after supplying the second flow of the chemical solution over the substrate, mounting pellicle on the substrate, wherein the substrate is a photomask.

9. The method as claimed in claim 8, wherein the thermal image is imaged by a photocell sensor.

10. The method as claimed in claim 8, further comprising discharging an ultraviolet radiation to the chemical solution.

11. The method as claimed in claim 8, wherein the image analysis comprises performing an image comparison by comparing a matrix of pixel at once.

12. The method as claimed in claim 11, wherein a wavelength each pixel is in a range from about 3 μm to about 12 μm.

13. The method as claimed in claim 8, wherein the image analysis comprises calculating an area of a specific color in the thermal image in pseudo color form.

14. The method as claimed in claim 8, wherein the chemical solution comprises cleaning solution.

15. The method as claimed in claim 8, further comprising heating the substrate to a desired temperature.

16. The method as claimed in claim 8, further comprising moving the first dispensing nozzle vertically.

17. A substrate processing system for supplying a chemical solution over a substrate, comprising:
- a processing chamber;
- a liquid-dispensing module comprising a dispensing nozzle, connected to the processing chamber and configured to supply a chemical solution into the processing chamber;
- a thermo-graphic camera positioned in the processing chamber and configured to record a thermal image of the chemical solution from the supplying module when no substrate is positioned in the processing chamber, wherein the thermo-graphic camera comprises a photocell sensor;
- an information-handling module comprising a processor connected to the thermo-graphic camera and configured to analyze the thermal image recorded by the thermo-graphic camera; and
- a control module comprising a computer integrated manufacturing host and connected to the information-handling module, wherein the control module compares the result of the analysis with a baseline before moving a substrate into the processing chamber, and issues a warning signal when the result of the analysis of the thermal image is outside an allowable deviation from the baseline, wherein the control module allows the substrate to be moved into the processing chamber when no warning signal issued by the control module is detected.

18. The substrate processing system as claimed in claim 17, wherein the chemical solution comprises a developer solution or a cleaning solution.

19. The substrate processing system as claimed in claim 17, wherein the substrate comprises a photo mask or a semiconductor wafer.

20. The substrate processing system as claimed in claim 17, further comprising a substrate stage disposed in the processing chamber and configured to be operable for translational and rotational motions.

* * * * *